US009373417B2

(12) United States Patent
Tong

(10) Patent No.: US 9,373,417 B2
(45) Date of Patent: Jun. 21, 2016

(54) CIRCUIT AND METHOD FOR TESTING MEMORY DEVICES

(71) Applicant: Integrated Silicon Solution (Shanghai), Inc, Shanghai (CN)

(72) Inventor: Mingzhao Tong, Shanghai (CN)

(73) Assignee: Integrated Silicon Solution (Shanghai), Inc., Shanghai (CN)

( * ) Notice: Subject to any disclaimer, the term of this patent is extended or adjusted under 35 U.S.C. 154(b) by 122 days.

(21) Appl. No.: 14/225,438

(22) Filed: Mar. 26, 2014

(65) Prior Publication Data

US 2014/0298120 A1    Oct. 2, 2014

(30) Foreign Application Priority Data

Mar. 29, 2013  (CN) .......................... 2013 1 0108760

(51) Int. Cl.
*G11C 29/00* (2006.01)
*G11C 29/10* (2006.01)
*G11C 29/36* (2006.01)
*G11C 29/04* (2006.01)

(52) U.S. Cl.
CPC ............... *G11C 29/10* (2013.01); *G11C 29/36* (2013.01); *G11C 2029/0405* (2013.01)

(58) Field of Classification Search
CPC . G11C 29/10; G11C 29/36; G11C 2029/0405
See application file for complete search history.

(56) References Cited

U.S. PATENT DOCUMENTS

| 5,553,082 A * | 9/1996 | Connor et al. ................ 714/733 |
| 2005/0204234 A1 * | 9/2005 | Bacigalupo .................... 714/733 |
| 2008/0222460 A1 * | 9/2008 | Kim et al. ...................... 714/702 |

* cited by examiner

*Primary Examiner* — Bryce Bonzo
*Assistant Examiner* — Thien D Nguyen
(74) *Attorney, Agent, or Firm* — Jun He Law Offices P.C.; Zhaohui Wang

(57) ABSTRACT

The present application provides a circuit and method for testing a memory device. The memory device has multiple blocks addressable via a plurality of address lines and capable of inputting and/or outputting data via a plurality of data lines. The circuit comprises: a test pattern generator coupled to a first portion of the plurality of address lines to receive test data, and configured to store the test data and to generate a write test vector and a read test vector according to the test data, wherein the write test vector is associated with the read test vector; a multiplexer coupled to the test pattern generator, and configured to selectively transmit the write test vector to a subject block of the multiple memory blocks to enable the write test vector to be written into the subject block; and a comparator coupled to the test pattern generator and the subject block, and configured to compare the read test vector with a readout signal generated from the subject block and the write test vector, and to generate a flag indicative of the comparison result.

16 Claims, 15 Drawing Sheets

|   | X |   |   |   |
|---|---|---|---|---|
| Y | 000 | 001 | 010 | 011 |
| 100 | 0 | 0 | 0 | 0 |
| 101 | 1 | 1 | 1 | 1 |
| 110 | 0 | 0 | 0 | 0 |
| 111 | 1 | 1 | 1 | 1 |

Figure 4c

|   | X |   |   |   |
|---|---|---|---|---|
| Y | 000 | 001 | 010 | 011 |
| 100 | 0 | 1 | 0 | 1 |
| 101 | 1 | 0 | 1 | 0 |
| 110 | 0 | 1 | 0 | 1 |
| 111 | 1 | 0 | 1 | 0 |

Figure 4d

|   | Mode[2] | Mode[1] | Mode[0] | Test Pattern |
|---|---|---|---|---|
| State 1 | 0 | 0 | 0 | Scan Pattern |
| State 2 | 0 | 0 | 1 | Row Bar Pattern |
| State 3 | 0 | 1 | 0 | Column Bar Pattern |
| State 4 | 0 | 1 | 1 | Check-Board Pattern |
| State 5 | 1 | 0 | 0 | RMW + Scan Pattern |
| State 6 | 1 | 0 | 1 | RMW + Row Bar Pattern |
| State 7 | 1 | 1 | 0 | RMW + Column Bar Pattern |
| State 8 | 1 | 1 | 1 | RMW + Check-Board Pattern |

Figure 5

CIRCUIT AND METHOD FOR TESTING MEMORY DEVICES

FIELD OF THE INVENTION

The present application relates to integrated circuits, particularly to a circuit and method for testing a memory device.

BACKGROUND OF THE INVENTION

With the rapid development of semiconductor fabrication technologies, the size of an integrated circuit chip has been reduced, but the number of chips integrated on a wafer has increased accordingly. For example, for a 4M-bit Static Random Access Memory (SRAM) chip, about 1670 chips can be fabricated in an 8-inch wafer by using the 0.13 µm fabrication process, and about 6050 chips can be fabricated in a 12-inch wafer by using the 65 nm fabrication process.

The time required for testing a SRAM chip having specific storage capacity (e.g. 4M-bit) is substantially constant. That is to say, the increase of chips integrated on a wafer may significantly increase the testing time required for performing a wafer level test. Therefore, the time required for testing a 12-inch wafer manufactured by the 65 nm fabrication process is about 3.6 times of the time required for testing an 8-inch wafer manufactured by the 0.13 µm fabrication process, thereby further increases the testing cost.

To shorten the time for testing a wafer, the technology of the prior arts uses a test machine to perform a parallel test on Multiple Devices Under Test (Multi-DUT), for example, to test 8, 16 or 32 chips under test simultaneously. However, the test capability of the parallel test is limited by the number of pins needed to be connected to each of the chips and the test pin resource of the test machine. Again, taking the 4M-bit SRAM chip as an example, if the SRAM chip has 16 data channels, then 16 data lines, 18 address lines and at least 5 control lines are needed. During the parallel test, the address lines and control lines of different chips may input the same signals, therefore the at least 23 address and control lines may share the signal channels of the test machine. However, the 16 data lines of the SRAM chip correspond to the respective memory cells of the SRAM chip, and during testing, the memory cells of different SRAM chips need to output respective readout signals to indicate whether they fail or not. Consequently, the data lines of the SRAM chips are required to be connected to the signal channels, which are independent from each other, of the test machine. Therefore, a total of at least 16*16+23=279 signal channels are needed for testing 16 chips in parallel. The cost of the test machine increases as the number of signal channels provided within the test machine increases, therefore the above mentioned parallel test method cannot effectively reduce the test cost.

Thus, there is a need for a circuit and method for testing memory devices, capable of reducing the number of required signal channels of the test machine, thereby reducing the time and cost needed for performing the wafer level test.

SUMMARY OF THE INVENTION

An objective of the present application is to provide a circuit and method for testing memory devices, capable of reducing the number of required signal channels of the test machine, thereby reducing the time and cost needed for performing a wafer level test.

According to an aspect of the present application, a circuit for testing a memory device is provided. The memory device has multiple memory blocks addressable via a plurality of address lines and capable of inputting and/or outputting data via a plurality of data lines. The circuit comprises a test pattern generator coupled to a first portion of the plurality of address lines to receive test data, and configured to store the test data and to generate a write test vector and a read test vector according to the test data, wherein the write test vector is associated with the read test vector; a multiplexer coupled to the test pattern generator, and configured to selectively transmit the write test vector to a subject block of the multiple memory blocks to enable the write test vector to be written into the subject block; and a comparator coupled to the test pattern generator and the subject block, and configured to compare the read test vector with a readout signal generated from the subject block and the write test vector, and to generate a flag indicative of the comparison result.

The circuit for testing the memory device according to the present application can transmit the test data for generation of the test vectors to the subject memory block via the address lines, thereby it is not required to provide data channels in the test machine for inputting the test pattern into the memory device. The test result may be degenerately represented by the flag and outputted, i.e., the bit of the flag is less than that of a storage byte of each memory block. In this way, it is not required to integrate additional data channels in the test machine to provide the test data to the subject memory device. The number of memory devices tested in parallel on the test machine may significantly increase, and therefore the cost and time for the wafer level test may be reduced.

In certain embodiments, the test pattern generator is further coupled to a second portion of the plurality of address lines to receive a mode control signal; and the test pattern generator is further configured to store the mode control signal, and to generate the read test vector and the write test vector according to the test data, the mode control signal and an address signal corresponding to the subject block. In this way, under the control of the mode control signal, the test pattern generator can generate the same write/read test vector or different write/read test vectors according to different address signals corresponding to the subject blocks.

In certain embodiments, the address signal is received from the plurality of address lines.

In certain embodiments, the mode control signal includes a first part for controlling the generation of the read test vector according to the test data and the address signal, and a second part for controlling the generation of the write test vector according to the read test vector. In this way, the test pattern generator can generate the same write and read test vector or different write and read test vectors according to requirement of the test algorithms.

In certain embodiments, the test pattern generator comprises a first register coupled to the first portion of the plurality of address lines and coupled to receive a state control signal, and configured to store the test data at an edge of the state control signal; a second register coupled to the second portion of the plurality of address lines and coupled to receive the state control signal, and configured to store the mode control signal at the edge of the state control signal; a mode controller coupled to the second register, and configured to generate a read inverting signal and a write inverting signal according to the mode control signal; a read test vector generator coupled to the first register and the mode controller, and configured to generate the read test vector according to the test data and the read inverting signal; and a write test vector generator coupled to the read test vector generator and the mode controller, and configured to generate the write test vector according to the read test vector and the write inverting signal. The test pattern generator comprising the above modules is simple in structure and low in implement cost.

In certain embodiments, the multiplexer is further coupled to the plurality of data lines to receive an input data signal and coupled to receive a state control signal, and further configured to selectively transmit the input data signal or the write test vector to the subject block in response to the state control signal. With the multiplexer, the test circuit will not affect normal operation of the subject memory device (i.e. implementing data write and read operation to store data), so that the test circuit will be fully compatible with the design of existing memory devices.

In certain embodiments, the multiplexer comprises a plurality of channels for multiplexing each line of the plurality of data lines with each bit of the write test vector.

In certain embodiments, the comparator comprises an XNOR gate having a plurality of channels for comparing each bit of the readout signal with each bit of the read test vector; and an AND gate for ANDing each bit of the comparison result to generate the flag. In this way, the flag indicating whether the readout signal is identical to the read test vector may degenerate to 1 bit, which significantly reduces the number of data channels of the test machine required for performing the test.

In certain embodiments, the write test vector is inverse or identical to the read test vector.

In certain embodiments, the multiplexer and the comparator are integrated in each block of the multiple memory blocks of the memory device.

According to another aspect of the present application, there is provided a method for testing a memory device having multiple memory blocks addressable via a plurality of address lines and capable of inputting and/or outputting data via a plurality of data lines. The method comprises storing test data from a first portion of the plurality of address lines; generating a write test vector and a read test vector according to the test data, wherein the write test vector is associated with the read test vector; transmitting the write test vector to a subject block of the multiple memory blocks to enable the write test vector to be written into the subject block selectively; and comparing the read test vector with a readout signal generated from the subject block and the write test vector to generate a flag indicative of the comparison result.

The foregoing has outlined, rather broadly, features of the present application. Additional features of the present application will be described, hereinafter, which form the subject of the claims of the present application. It should be appreciated by those skilled in the art that the concepts and specific embodiments disclosed herein may be readily utilized as a basis for modifying or designing other structures or processes for carrying out the objectives of the present application. It should also be understood by those skilled in the art that such equivalent constructions do not depart from the concept and scope of the present application as set forth in the appended claims.

BRIEF DESCRIPTION OF DRAWINGS

The aforementioned features and other features of the application will be further described in the following paragraphs by referring to the accompanying drawings and the appended claims. It will be understood that these accompanying drawings merely illustrate some embodiments in accordance with the present application and should not be considered as a limitation to the scope of the present application.

Unless otherwise specified, the accompanying drawings need not be proportional, and similar reference characters generally denote similar elements.

FIGS. 4(*a*)-4(*d*) illustrate 4 types of test patterns;

FIG. 5 illustrates a state transition table for a mode control signal according to an embodiment of the preset application;

DETAILED DESCRIPTION OF THE INVENTION

The following detailed description refers to the accompanying drawings as a part of the present application. The illustrative embodiments described in the detailed description, the accompanying drawings and the claims are not to limit the present application, and other embodiments may be adopted, or modifications may be made without deviating from the concept and subjective of the application. It should be understood that the various aspects of the application described and graphically presented herein may be arranged, replaced, combined, divided and designed in many different configurations and these different configurations are implicitly included in the application.

Figure 1:
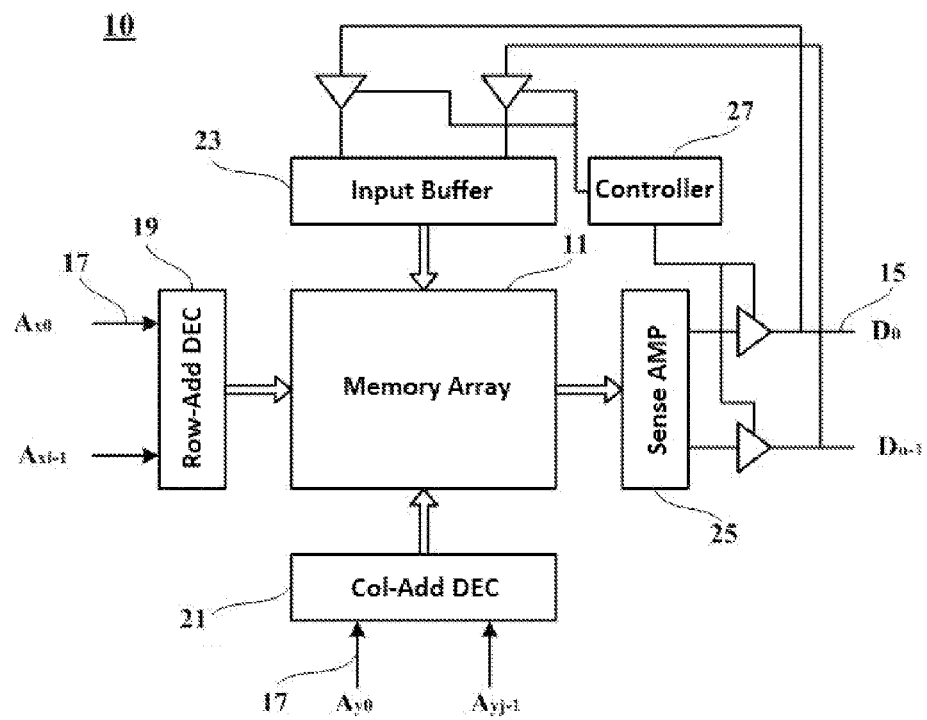
FIG. 1 illustrates a memory device 10 according to an embodiment of the present application.

FIG. 1 shows a memory device 10 according to an embodiment of the present application. The memory device 10 in FIG. 1 is a SRAM memory. It will be readily appreciated that the memory device 10 may be any other memory device having a circuit schematic similar to the SRAM memory.

As shown in FIG. 1, the memory device 10 includes a memory array 11 having multiple addressable memory blocks (not shown). Each memory block may have one or more memory cell (not shown) for storing 1-bit data. The memory device 10 further includes a plurality of data lines 15 for inputting data into the memory blocks of the memory array 11 and/or outputting data from the memory blocks, and a plurality of address lines 17 for addressing the memory blocks. The memory device 10 in FIG. 1 has n data lines 15 and m address lines 17.

Specifically, the address lines 17 include i row address lines $A_{X0}$-$A_{Xi-1}$ and j column address lines $A_{Y0}$-$A_{Yj-1}$, wherein i+j=m. Moreover, the row address lines $A_{X0}$-$A_{Xi-1}$ are coupled to the memory array 11 via a row address decoder 19, and the column address lines $A_{Y0}$-$A_{Yj-1}$ are coupled to the memory array 11 via a column address decoder 21. The row address decoder 19 and the column address decoder 21 are capable of decoding row addresses and column addresses received from the address lines, respectively, to select a memory block needed to be read from or written into.

The data lines 15 include data lines $D_0$-$D_{n-1}$, which are coupled to the memory blocks. Each of the data lines is coupled to one or more memory cell of each memory block. In certain embodiments, each of the memory blocks has n memory cells, then each data line is coupled to a memory cell of the memory block to input or output data. In certain embodiments, each of the memory blocks has 2n, 4n or more memory cells, and then each data line is coupled to 2, 4 or more memory cells of each memory block accordingly. The memory device 10 may control the selection of a specific memory cell among the multiple memory cells, which the data line is coupled to, via an additional byte control line (not shown in the drawings) to read or write data.

To control the read and write operation, the memory device 10 further includes an input buffer 23, a sense amplifier 25 and a controller 27. The input buffer 23 is coupled between a data input node of each memory cell of the memory array 11 and the data lines 15. The input buffer 23 is configured to buffer a data input signal inputted by the data lines 15 and to write the data input signal into the corresponding memory cells. The sense amplifier 25 is coupled between a data output node of each memory cell of the memory array 11 and the data lines 15, and is configured to sense and amplify data stored in each memory cell to generate a corresponding readout signal. The controller 27 is configured to receive an external control signal to control the read and write timing of the memory blocks of the memory array 11.

Figure 2:
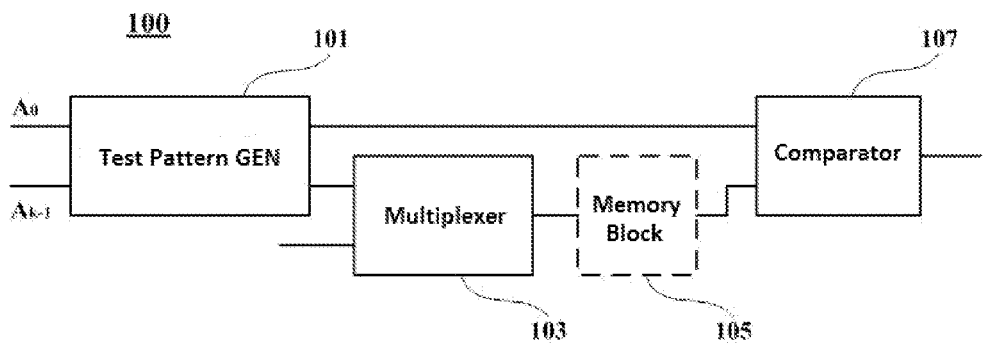
FIG. 2 illustrates a circuit 100 for testing a memory device according to an embodiment of the present application.

FIG. 2 shows a circuit 100 for testing a memory device according to an embodiment of the present application. The circuit 100 may be used to test whether the memory device 10 shown in FIG. 1 has functional defects, i.e. whether or not the data read out from the memory cells in the memory device 10 are identical to the data written into the memory cells. In practice, the circuit 100 may be used with a test machine. Furthermore, in the embodiment shown in FIG. 2, the number of memory cells contained in each memory block of the memory device being tested (the subject memory device) is the same as the number of data lines. In other words, each data line corresponds to one memory cell of each memory block. Also, the number of data lines is less than the number of address lines. In the following paragraphs, the embodiments of the present application are elaborated with the above example where each data line corresponds to one address cell and the number of data lines is less than the number of address lines. It will be readily appreciated that embodiments in which the subject memory device contains memory blocks having memory cells more than the data lines can be tested in a similar manner. For example, by using the byte control signal, data can be read from or write into different memory cells of a memory block via the data lines in batches during several read or write periods.

As shown in FIG. 2, the circuit 100 includes:

a test pattern generator 101 coupled to a first portion $A_0$-$A_{k-1}$ (i.e. k data lines) of multiple address lines $A_0$-$A_{m-1}$ (i.e. totally m data lines) to receive test data, and configured to store the test data and to generate a write test vector and a read test vector according to the test data, wherein the write test vector is associated with the read test vector;

a multiplexer 103 coupled to the test pattern generator 101, and configured to selectively transmit the write test vector to a subject block 105 of the multiple memory blocks to enable the write test vector to be written into the subject block 105; and a comparator 107 coupled to the test pattern generator 101 and the subject block 105, and configured to compare the read test vector with a readout signal generated from the subject block 105 and the write test vector, and to generate a flag indicative of the comparison result.

Specifically, when the circuit 100 is used to test the memory device, for example, when the memory device and the circuit 100 are coupled to the test machine, the test machine provides the test data to the circuit 100, which may be any k-bit data. As described above, the subject block 105 also has k-bit memory cells, so that the k-bit data of the test data corresponds to the k-bit memory cells of the subject block 105, respectively.

The test data is provided by the test machine via the address lines $A_0$-$A_{k-1}$ coupled to the test pattern generator 101. In actual practice, the address lines $A_0$-$A_{k-1}$ and the other address lines $A_k$-$A_{m-1}$ need to receive an address signal for addressing the memory blocks during the read/write operation of the memory device. Therefore, the test data can be provided to the circuit 100 when the address lines $A_0$-$A_{k-1}$ are not receiving the address signal. For example, the test data may be provided to the circuit 100 during an idle or standby state of the memory device when the read/write operation is not performed. The test data may be stored in the test pattern generator 101 after being provided to the test pattern generator 101. For example, the test pattern generator 101 may have register(s) for buffering the test data.

Next, the test pattern generator 101 generates the read test vector and the write test vector, which are in association with each other, according to the test data stored in the test pattern generator 101. For example, the read test vector may be identical to the write test vector, or the read test vector may an inverse of the write test vector (i.e. the inverted binary code of the write test vector). In certain embodiments, the read test vector generated from the test data may be identical to the test data; and the write test vector may be identical to or different from the test data. In the subsequent process, the subject block 105 may write the write test vector thereinto, and then readout the write test vector to generate the readout signal. It will be understood that if the subject block 105 has no functional defect, the generated readout signal shall be identical to the previously written write test vector. On the other hand, if the subject block 105 has functional defect(s), the generated readout signal shall be at least partially different from the write test vector. For example, one or more bits of the readout signal may be different from the corresponding bits of the write test vector.

As the read test vector is associated with the write test vector, the read test vector can be a reference for determining whether the readout signal is different from the write test vector. Accordingly, the comparator 107 receives the readout signal from the subject block 105 and the read test vector from the test pattern generator 101, and compares them bitwise. Specifically, if the read test vector is identical to the write test vector, the readout signal is directly compared with the read test vector generated from the same test data to generate the flag indicative of the comparison result. In this case, a result showing that the readout signal is identical to the read test vector indicates that the subject block 105 has no defect, and a result showing that the readout signal is different from the read test vector indicates that the subject block may have defect(s). In certain embodiments, the flag may be a 1-bit digital signal. That is, the comparator 107 outputs a flag indicating that the readout signal is different from the read test vector when any bit of the readout signal is different from the corresponding bit of the read test vector, such as the flag is set to be "1", and the comparator 107 outputs a flag indicating that the readout signal is identical to the read test vector when each bit of the readout signal is identical to the corresponding bit of the read test vector, such as the flag is set to be "0". In this way, only 1-bit data channels are needed in the test machine to receive the flag generated by the comparators of the memory blocks, thereby to determine whether the subject block has defect(s). This method significantly reduces the use of the resources of the test machine, and increases the number of chips being tested in parallel. Therefore, the cost for the test reduces accordingly. In certain embodiments, the flag may be a k-bit digital signal having the same number of bits as the readout signal and the read test vector. Then the flag may indicate the comparison result of the readout signal and the read test vector bitwise. Furthermore, the flag may degenerate, that is, the generated flag may be a digital signal having bits less than k. For example, the data at two or more bits of the flag degenerates to 1-bit data using the AND operation.

In certain embodiments, the read test vector associated with the write test vector may be different from the read test vector, such as the read test vector is inverse to the write test vector. In this case, the subject block 105 may receive the test data twice, and the test data received twice (e.g. first test data and second test data) are different from each other. That is, the first test data is the inverse binary code of the second test data. After a first test vector generated according to the first test data is written into the subject block 105, the test pattern generator 101 re-obtains the second test data and generates a second read test vector, and optionally a second write test vector, according to the second test data. For example, the test pattern generator 101 receives and stores the second test data during the subsequent test period. In particular, the first write test vector is inverse to the first read test vector, i.e. being inverse to the first test data, and the second read test vector is identical to the second test data, wherein the second test data is inverse to the first test data. Thereafter, the subject block 105, which the first write test vector is written into, generates the readout signal, which should be identical to the first write test vector if the subject block 105 has no defect. Afterwards, the comparator 107 compares the readout signal with the second read test vector, and outputs the flag indicating that the subject block 105 has no defect when these two signals are identical to each other, or outputs the flag indicating that the subject block has a defect when these two signals are different from each other.

It should be noted that, the logic relationship between the write test vector, the read test vector and the test data described in the above embodiment is merely exemplary. In other examples, the write test vector and the read test vector may be associated with each other in any suitable logic relationship, and may both be associated with the test data provided by the test machine. The test pattern generator 101 may perform logic computation on the test data stored therein to generate the required write and read test vectors.

The multiplexer 103 controls the transmission of the write test vector to the subject block 105. Specifically, the multiplexer 103 controls what data is to be provided to a data input node of the subject block 105. For example, the multiplexer 103 may receive a state control signal from the test machine, and transmits the write test vector to the subject block 105 for the write operation when the state control signal is in a first state, or prohibits the transmission of the write test vector to the subject block 105 when the state control signal is in a second state, which is different from the first state. Optionally, the multiplexer 103 may be coupled to the plurality of data lines to receive a data input signal, and transmit the data input signal to the subject block 105 for the write operation when the state control signal is in the second state. As a result, the state control signal may be used to switch the memory device 10 to operate in a test mode and a non-test mode (i.e. the normal operation mode). Thus, the multiplexer 103 prevents the circuit 100 from interrupting the normal operation of the memory device 10, so that the test circuit 100 can be compatible with the design of the existing memory devices.

As described above, the comparator 107 is configured to compare the read test vector and the readout signal to generate the flag indicative of the comparison result. Specifically, the comparator 107 is coupled to the signal output node of the subject block 105 to receive the readout signal. Furthermore, the signal output node of the subject block 105 may also be directly coupled to the data lines $D_0$-$D_{n-1}$ to output the stored data in the non-test mode. Therefore, the comparator 107 is still compatible with the design of the existing memory devices.

The multiplexer 103 and the comparator 107 need to be coupled to each subject block 105 separately. Thus, in some examples, the multiplexer 103 and the comparator 107 may be integrated within each block of the multiple memory blocks of the memory device 10 to independently indicate whether the memory blocks have defects.

In view of the above, the circuit 100 for testing the memory device 10 according to the present application can transmit the test data for generation of the test vectors to the subject block via the address lines, thereby it is not required to provide data channels in the test machine for inputting the test pattern into the memory device. The test result may be degenerately represented by the flag and outputted, i.e., the bit of the flag is less than that of a storage byte of each memory block. In this way, it is not required to integrate additional data channels in the test machine to provide the test data to the memory device. The number of memory devices 10 tested in parallel on the test machine may significantly increase, and therefore the cost and time for the wafer level test may be reduced.

Figures 3, 4A, 4B:
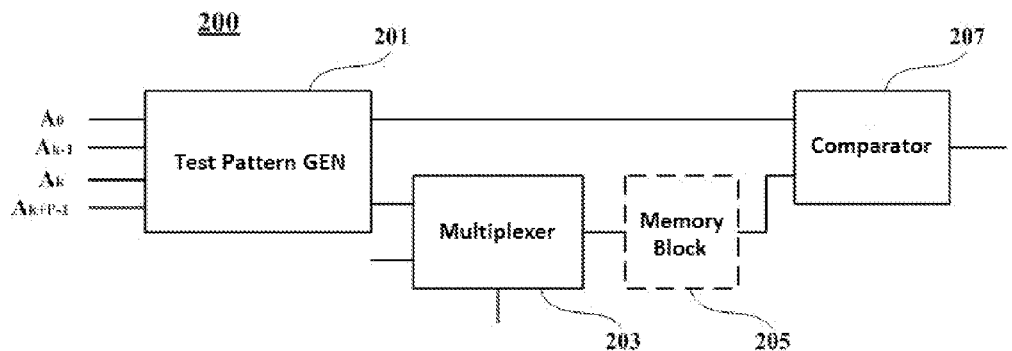
FIG. 3 illustrates a circuit 200 for testing a memory device according to an embodiment of the present application.

FIG. 3 shows a circuit 200 for testing a memory device according to an embodiment of the present application. In the embodiment, the circuit 200 may receive an address signal, and provide test vectors (including a read test vector and a write test vector) to the corresponding subject blocks of the memory device according to the address signals. That is to say, the circuit 200 may generate specific test patterns.

As shown in FIG. 3, the circuit 200 includes:

a test pattern generator 201 coupled to a first portion $A_0$-$A_{k-1}$ (i.e. k data lines) of multiple address lines $A_0$-$A_{m-1}$ (i.e. totally m data lines) to receive test data, and coupled to a second portion $A_k$-$A_{k+p-1}$ of the multiple address lines $A_0$-$A_{m-1}$ to receive a mode control signal; the test pattern generator 201 being configured to store the test data and the mode control signal, and to generate a write test vector and a read test vector according to the test data and the address signal corresponding to the subject block 205 of the multiple memory blocks, wherein the write test vector is associated with the read test vector;

a multiplexer 203 coupled to the test pattern generator 201, and configured to selectively transmit the write test vector to the subject block 205 to enable the write test vector to be written into the subject block 205; and a comparator 207 coupled to the test pattern generator 201 and the subject block 205, and configured to compare the test vector with a readout signal generated from the subject block 205 and the write test vector, and to generate a flag indicative of the comparison result.

In the embodiment shown in FIG. 3, the second portion $A_k$-$A_{k+p-1}$ of the address lines $A_0$-$A_{m-1}$ are illustrated differently from the first portion $A_0$-$A_{k-1}$ of the address lines. In other words, the circuit 200 uses two different groups of address lines to receive the mode control signal and the test data. In certain embodiments, the second portion of the address lines $A_0$-$A_{m-1}$ for receiving the mode control signal may be partially or fully identical to the first portion of the address lines for receiving the test data. For example, the test pattern generator 201 may use different registers to store the test data and the mode control signal received from the data lines.

In some examples, to more accurately screen the blocks having defects, various types of test patterns may be used. With respect to the different test patterns, the write test vector to be written into the memory blocks of the memory device 10 shown in FIG. 1 may change with the address of the memory blocks. FIGS. 4a-4d show 4 different types of test patterns.

As shown in FIGS. 4a-4d, a square labeled with "0" or "1" represents a memory block. The x direction represents a row direction in which the memory blocks are arrayed, and each column is defined with a row address. The y direction represents a column direction in which the memory blocks are arrayed, and each row is defined with a column address. FIG. 4a is the Scan Pattern, where the write test vectors written into the memory blocks are identical to each other. FIG. 4b is the Row Bar Pattern, where the write test vectors written into the memory blocks in the same column are identical to each other, but the write test vectors written into two neighboring memory blocks in the same row are inverse to each other (i.e. the data written into the corresponding memory cells of the two memory blocks is inverse to each other). FIG. 4c is the Column Bar Pattern, where the write test vectors written into the memory blocks in the same row are identical to each other, but the write test vectors written into two neighboring memory blocks in the same column are inverse to each other. FIG. 4d is the Check-Board Pattern, where the write test vector written into each memory block is inverse to those written into its neighboring blocks. The 4 types of test patterns can be used to test the influence of the interrelationship between the subject block and its neighboring blocks so as to accurately screen the memory block(s) having defects.

The mode control signal received by the test pattern generator 201 can be used to control which type of test pattern is selected to test the memory device. For example, the mode control signal may have 2-bit data, and the 4 values of the 2-bit data correspond to the 4 types of test patterns, respectively. The test pattern generator 201 may decode the 2-bit data included in the received mode control signal, and select the corresponding test pattern according to the decoding result. The test pattern generator 201 may further generate the write test vector according to the selected test pattern, the address signal and the test data.

In practical applications, certain test algorithms require the memory device under test to operate in the "Read-Modify-Write" (RMW) mode. In this mode, each of the subject blocks is required to perform a "read D and write /D" or "read /D and write D" operation. To implement such algorithms, the test pattern generator 201 has to generate the write and read test vectors inverse to each other as required by the algorithms. Accordingly, the mode control signal may include another 1-bit data, which indicates whether the subject block is in the RMW mode.

Therefore, in certain embodiments, the mode control signal may include a first part for controlling the generation of the read test vector according to the test data and the address signal, and a second part for controlling the generation of the write test vector according to the read test vector. Upon receiving the mode control signal, the test pattern generator can decode the mode control signal and convert the test data into the write test vectors or read test vectors according to the specific values of the two parts of the mode control signal. FIG. 5 shows a state transition table for the mode control signal according to an embodiment of the preset application. As shown in FIG. 5, the mode control signal has 3-bit data Mode[2:0]. The subject block is in the RMW mode if the highest bit Mode[2] is "1". Moreover, when the two lower bits Mode[1:0] is "00", "01", "10" or "11", the test pattern will be selected as the "scan pattern", "row bar pattern", "column bar pattern" and "check-board pattern", respectively.

As described above, the test patterns are defined according to the lowest bit of the row address and the lowest bit of the column address of the memory blocks. Therefore, to determine the read and write test vectors for each subject block, the test pattern generator 201 may need to receive the two lowest bits of the row and column addresses of the subject block, and generate the corresponding read and write test vectors in combination with these two values. For example, when the subject memory device is in the row bar pattern, the write test vector generated by the test mode generator 201 is the same as the test data for the memory blocks having the lowest bit of the column address being "0", and the generated write test vector is inverse to the test data for those memory blocks having the lowest bit of the column address being "1". Similarly, when the subject memory device is in the column bar pattern, the write test vector generated by the test mode generator 201 is the same as the test data for those memory blocks having the lowest bit of the row address being "0", and the generated write test vector is inverse to the test data for those memory blocks having the lowest bit of the row address being "1". When the subject memory device is in the check-board pattern, the write test vector generated by the test mode generator 201 is the same as the test data for those memory blocks having the lowest bits of the row and column addresses being "0", and the generated write test vector is inverse to the test data for those memory blocks having the lowest bits of the row and column addresses being "1". It should be noted that, the circuit 200 receives the test data, the mode control signal and the address signal by multiplexing the address lines, i.e. the time for receiving the address signal is different from the time for receiving the test data and the mode control signal via the address lines. Therefore, the receiving of the address signal will not conflict with the receiving of the test data and the mode control signal.

The write test vector generated by the test pattern generator 201 may be selectively transmitted to the subject block 205 by the multiplexer 203. And the comparator 207 may compare the readout signal read from the subject block 205 and the read test vector, and generate the flag indicating the comparison result. The above process may be referred from the description of the embodiment shown in FIG. 2, which will not be elaborated herein.

In some examples, based on various combinational logic circuits, the test pattern generator 201 may convert the test data into the read and write test vectors by using the mode control signal and the address signal. This will be further described in the following paragraphs.

Figure 6:
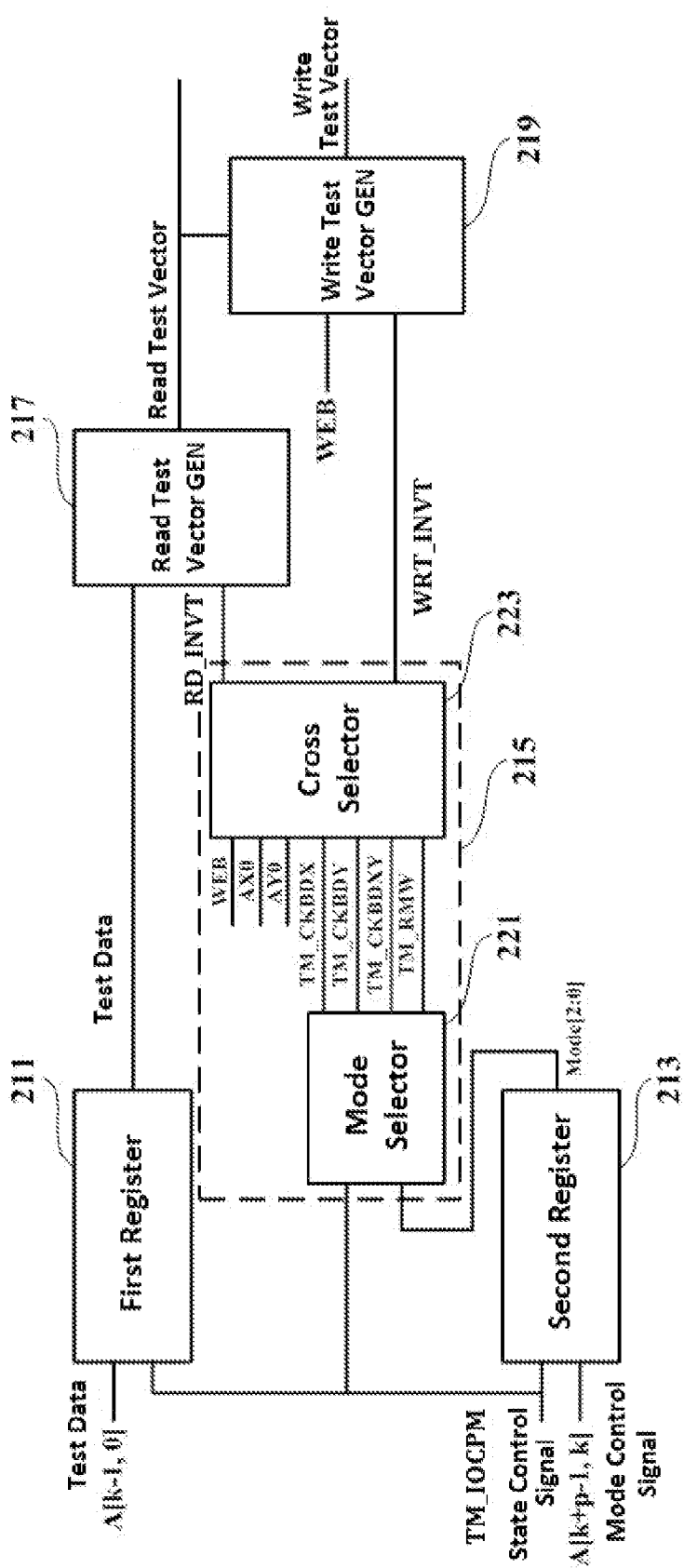
FIG. 6 illustrates a block diagram of a test pattern generator of the circuit 200 shown in FIG. 3.

FIG. 6 shows a block diagram of the test pattern generator of the circuit 200 shown in FIG. 3. In some examples, the test pattern generator is coupled to receive the state control signal. The state control signal is used to control the test circuit 200 and the subject memory device to switch between the test mode and the normal operation mode (i.e. the non-test mode).

As shown in FIG. 6, the test pattern generator includes:

a first register 211 coupled to the first portion $A_0$-$A_{k-1}$ of the plurality of address lines $A_0$-$A_{m-1}$ and coupled to receive the state control signal, and configured to store the test data at an edge of the state control signal;

a second register 213 coupled to the second portion $A_k$-$A_{k+p-1}$ of the plurality of address lines $A_0$-$A_{m-1}$ and coupled to receive the state control signal, and configured to store the mode control signal at the edge of the state control signal;

a mode controller 215 coupled to the second register 213, and configured to generate a read inverting signal and a write inverting signal according to the mode control signal;

a read test vector generator 217 coupled to the first register 211 and the mode controller 215, and configured to generate the read test vector according to the test data and the read inverting signal; and a write test vector generator 219 coupled to the read test vector generator 217 and the mode controller 215, and configured to generate the write test vector according to the read test vector and the write inverting signal.

As shown in FIG. 6, the mode controller 215 further includes a mode selector 221 and a cross selector 223. The mode selector 221 is coupled to the second register 213 to receive the mode control signal, and coupled to the state control signal TM_IOCPM. The mode selector 221 is configured to decode the mode control signal and output a row bar signal TM_CKBDX, a column bar signal TM_CKBDY, a check-board signal TM_CKBDXY and a RMW signal TM_RMW, which indicate different test patterns and write/read modes, respectively. In certain embodiments, when the row bar signal TM_CKBDX, the column bar signal TM_CKBDY and the check-board signal TM_CKBDXY are all equal to "0", the test pattern is selected to be the scan pattern. When the row bar signal TM_CKBDX is equal to "1" and the other two signals TM_CKBDY and TM_CKBDXY are equal to "0", the test pattern is selected to be the row bar pattern. When the column bar signal TM_CKBDY is equal to "1" and the other two signals TM_CKBDX and TM_CKBDXY are equal to "0", the test pattern is selected to be the column bar pattern. When the check-board signal TM_CKBDXY is equal to "1" and the other two signals TM_CKBDX and TM_CKBDY are equal to "0", the test pattern is selected to be the check-board pattern.

The cross selector 223 receives the lowest bit $A_{X0}$ of the row address and the lowest bit $A_{Y0}$ of the column address of the address signal, an enable signal WEB and the above four signals generated by the mode selector 221. The cross selector 223 may generate the read inverting signal RD_INVT and the write inverting signal WRT_INVT according to the test patterns shown in FIGS. 4a-4d and the state transition table shown in FIG. 5, to determine whether or not to invert the test data buffered in the first register 211 with respect to the memory blocks having specific addresses. In certain embodiments, the cross selector 223 may be used to receive other bit(s) of the address signal, such as any bit of the row address $A_{X1}$-$A_{Xi-1}$ and any bit of the column address $A_{Y1}$-$A_{Yi-1}$. The cross selector 223 further generates the read inverting signal RD_INVT and the write inverting signal WRT_INVT according to data contained in the received address signal and the aforementioned signals TM_CKBDX, TM_CKBDY and TM_CKBDXY.

Figure 7:
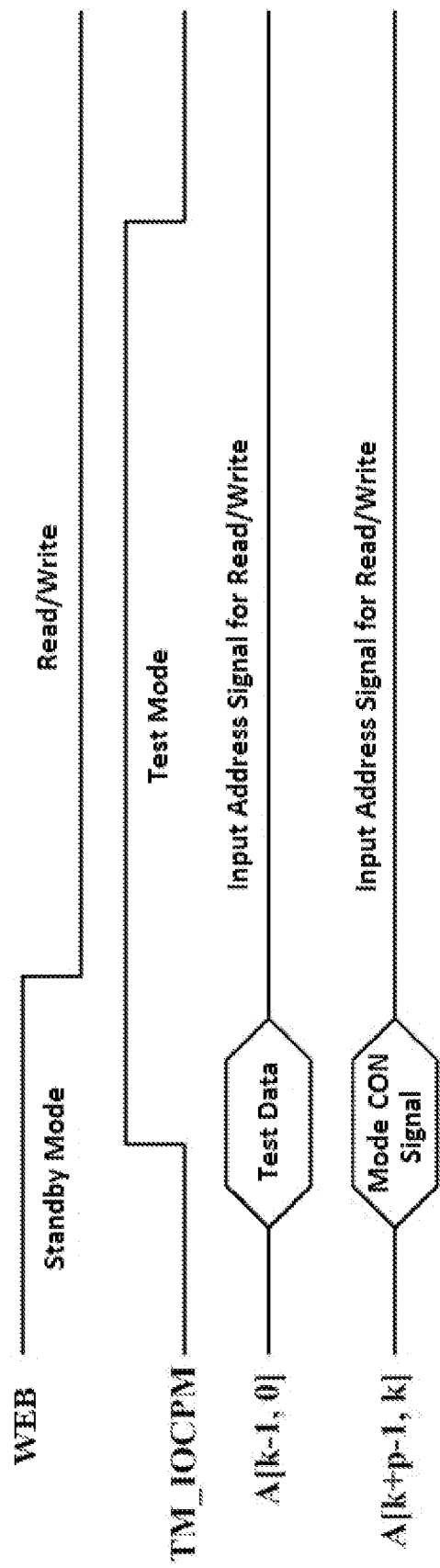
FIG. 7 illustrates a wave form of the circuit 200 shown in FIG. 3.

FIG. 7 shows a wave form of the circuit 200 shown in FIG. 3. Hereinafter, the operation of the test pattern generator will be elaborated with reference to FIGS. 6 and 7.

As shown in FIGS. 6 and 7, when the enable signal WEB is in a high level state, the memory device being tested is in a standby mode, and data cannot be written into or read from the addressed memory block. The first register 211 and the second register 213 are both coupled to the state control signal TM_IOCPM, while the first register 211 is coupled to the address lines $A_0$-$A_{k-1}$ and the second register 213 is coupled to the address lines $A_k$-$A_{k+p-1}$. In the standby mode, the address lines $A_0$-$A_{k-1}$ are provided with the test data from the test machine, and the address lines $A_k$-$A_{k+p-1}$ are provided with the mode control signal from the test machine.

When the memory device is still in the standby mode, the state control signal TM_IOCPM changes from the low level to the high level. In other words, an edge of the state control signal TM_IOCPM such as a rising edge occurs. The transition of the state control signal TM_IOCPM indicates that the test signal enters into the test mode from the non-test mode. Also at the rising edge, the first register 211 and the second register 213 respectively store the test data and the mode control signal therein to be used in the following process.

Next, the state control signal TM_IOCPM maintains in the high level state, and the enable signal WEB changes from the high level into the low level. Then the test machine provides the address signal to the memory device via the address lines $A_0$-$A_{m-1}$ to perform the write operation on each block of the memory device. The mode controller 215 also receives the address signal, particularly the lowest bit $A_{X0}$ of the row address and the lowest bit $A_{Y0}$ of the column address included in the address signal, and generates the write inverting signal and the read inverting signal corresponding to each subject block according to the address signal and the mode control signal. In particular, the read inverting signal is used to instruct the read test vector generator 217 to invert the test data buffered in the first register 211 to obtain the read test vector; the read inverting signal is used to instruct the write test vector generator 219 to invert the read test vector to obtain the write test vector. Subsequently, the test pattern generator can generate the read and write test vectors associated with each other.

In certain embodiments, the read test vector generator 217 may include an XOR gate or an XNOR gate having multiple channels, each of which receives one bit of the test data and the read inverting signal, and performs the XOR or XNOR operation on the test data according to the value of the received read inverting signal to invert the test data or maintain its initial value. Similarly, the write test vector generator 219 may include a multi-channel XOR gate or an XNOR gate, each of which receives one bit of the read test vector and the write inverting signal, and performs the XOR or XNOR operation on the read test vector according to the value of the received write inverting signal to invert the read test vector or maintain its initial value.

Thereafter, when the state control signal TM_IOCPM is still in the high level state, i.e., still within the test mode, the test pattern generator provides the generated write test vector to the subject block via the multiplexer, and the enable signal WEB controls the write operation of the write test vector on the subject block. Afterwards, the memory device reads the subject block to obtain the readout signal. Meanwhile, the test pattern generator also provides the read test vector to the comparator, so that the comparator may compare the readout signal with the read test vector to determine whether the subject block has any defect.

Finally, the state control signal TM_IOCPM switches from the high level to the low level to cause the test circuit and the memory device to quit the test mode.

Figure 8:
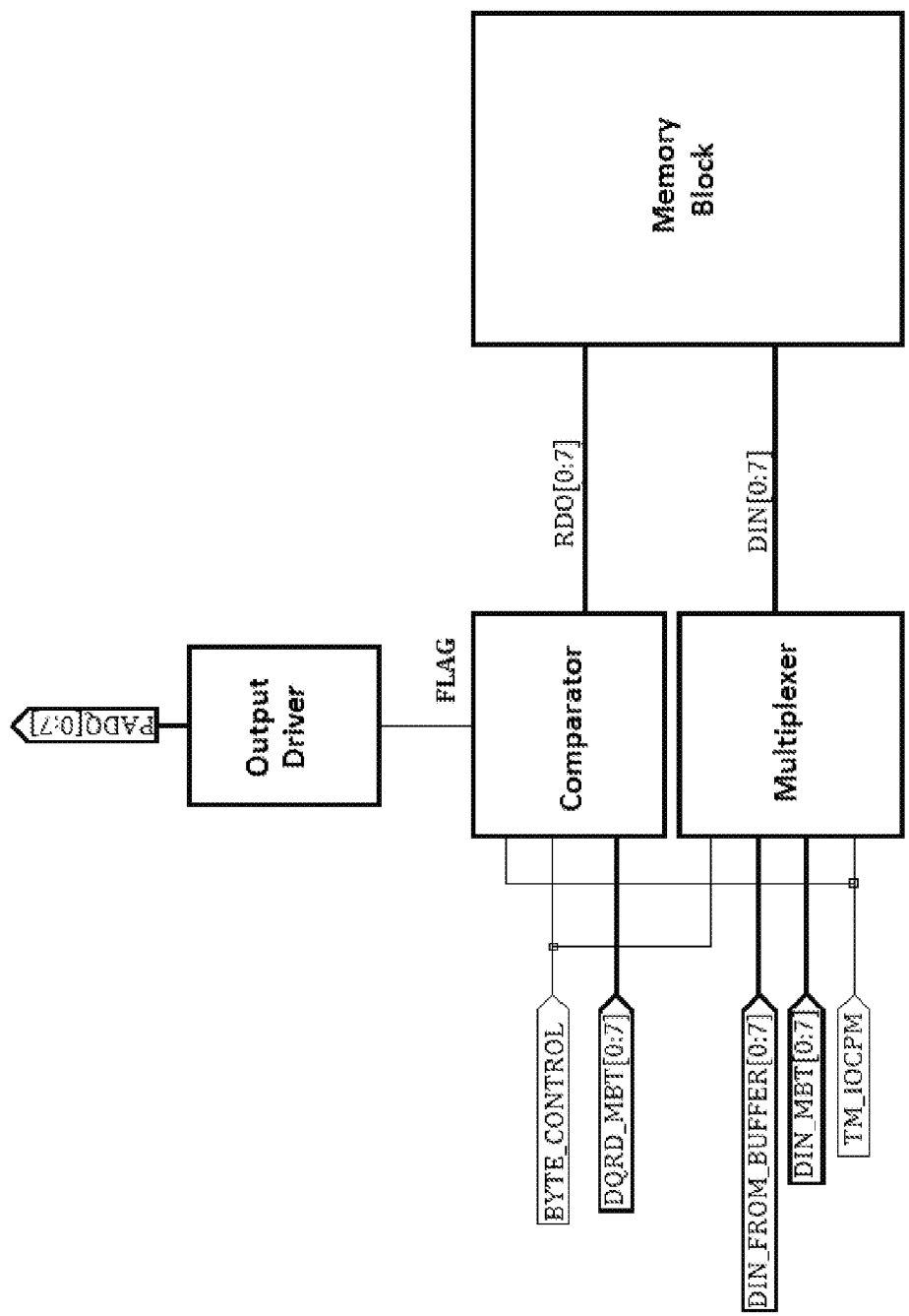
FIG. 8 illustrates a memory block that integrates a multiplexer and a comparator according to an embodiment of the present application.

FIG. 8 shows a memory block that integrates a multiplexer and a comparator according to an embodiment of the present application.

As shown in FIG. 8, the operation of the multiplexer and the comparator is controlled by the state control signal TM_IOCPM. Specifically, the multiplexer is coupled to an output port DIN_MBT[0:7] of the test pattern generator to receive an 8-bit write test vector and an output port DIN_FROM_BUFFER[0:7] to receive an 8-bit data input signal. Under the control of the state control signal TM_IOCPM, the multiplexer selectively provides the write test vector or the data input signal to an input port DIN[0:7] of the memory block. The comparator is coupled to an output port RDO[0:7] of the memory block to receive the readout signal and an output port DQRD_MBT[0:7] of the test pattern generator to receive the read test vector, thereby to compare the read test vector and the readout signal and output the flag indicative of the comparison result. Furthermore, the comparator is further coupled to an output driver to output the readout signal at port PADQ[0:7]. In certain embodiments, the multiplexer and the comparator may be coupled to receive a byte control signal BYTE_CONTROL, so that the byte control signal may control which memory cells in the memory block are selected for the write/read operation.

Figure 9:
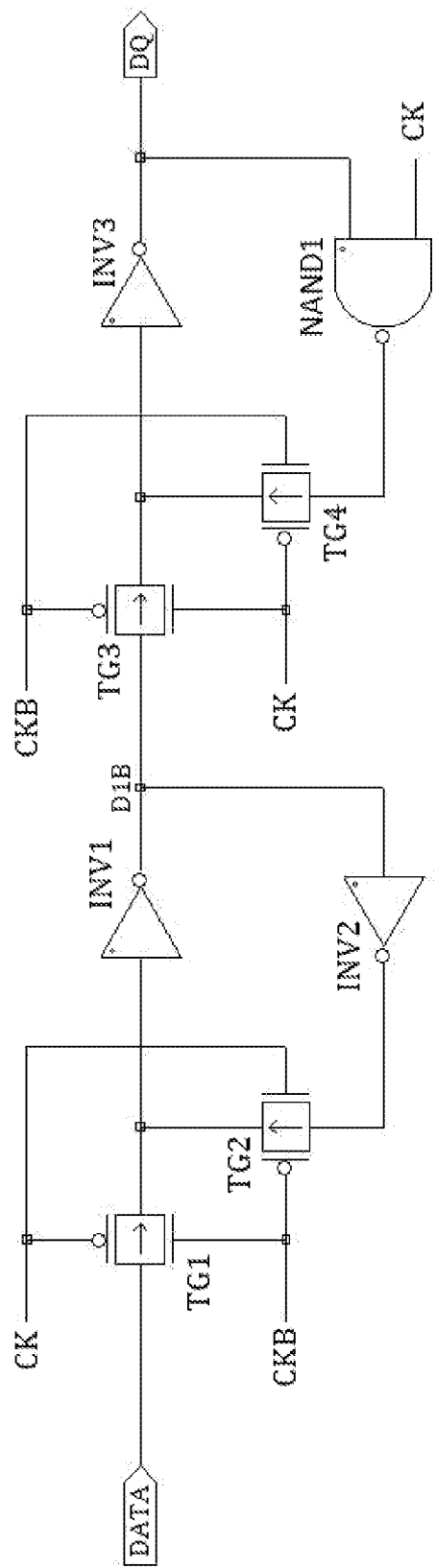
FIG. 9 illustrates a schematic of a first register or a second register of a test pattern generator shown in FIG. 6.

FIG. 9 shows a schematic of the first register or the second register of the test pattern generator shown in FIG. 6.

As shown in FIG. 9, the exemplary register is a master-slave positive edge-triggered flip-flop controlled by the state control signal TM_IOCPM. The register includes transmission gates TG1-TG4, inverters INV1-INV3 and a NAND gate NAND1. When the state control signal TM_IOCPM is at the low level, the transmission gate TG1 is turned on and the transmission gate TG2 is turned off, then the signal at the input node DATA (coupled to the address lines) is sampled and retained in an intermediate node D1B. When the state control signal TM_IOCPM changes from the low level to the high level, the transmission gate TG3 is turned on and the transmission gate TG4 is turned off. Then the signal retained in the intermediate node D1B is transferred to the output node DQ and retained there. Therefore, the data in the input node DATA, which is sampled at the rising edge of the state control signal TM_IOCPM, is transferred to the output node DQ.

Figure 10:
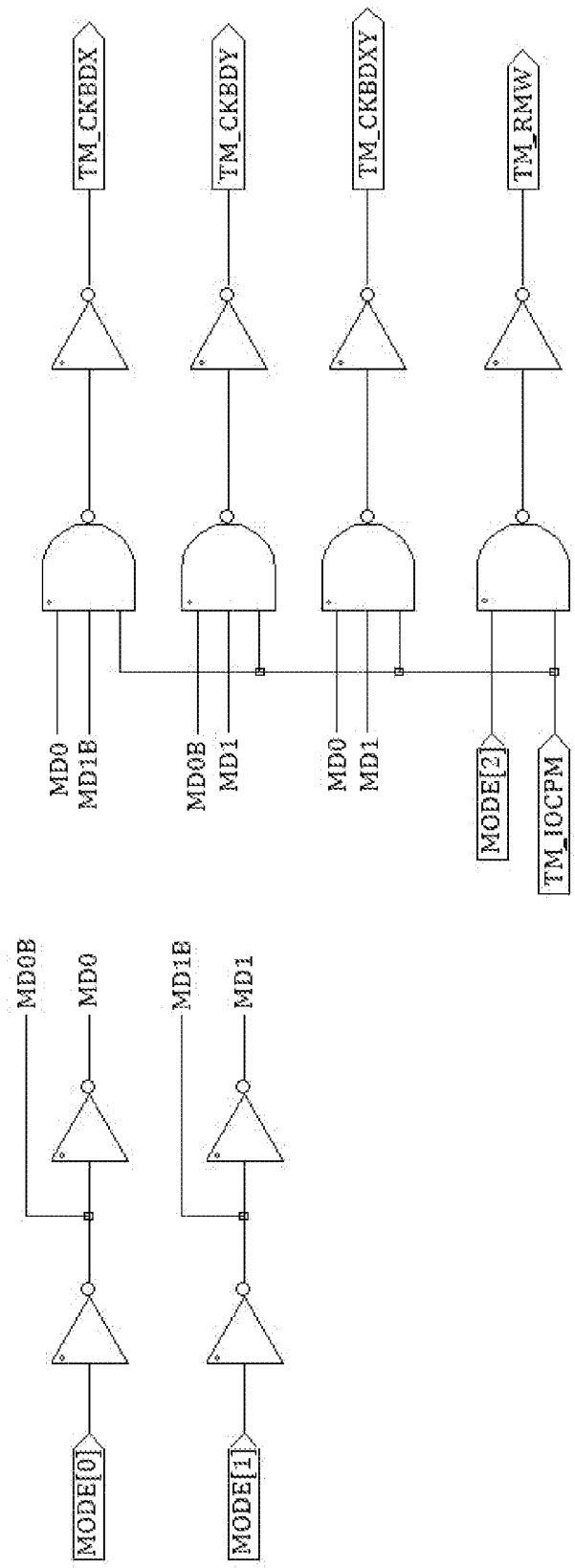
FIG. 10 illustrates a schematic of a mode selector of the test pattern generator shown in FIG. 6.

FIG. 10 shows a schematic of the mode selector of the test pattern generator shown in FIG. 6.

As shown in FIG. 10, the input nodes Mode[0] and Mode[1] are used to receive a first part of the mode control signal. In the example, the first part of the mode control signal is a 2-bit digital signal. After being bitwise inverted, the first part of the mode control signal, along with a second part of the mode control signal, is used to generate the row bar signal TM_CKBDX, the column bar signal TM_CKBDY, the check-board signal TM_CKBDXY and the RMW signal TM_RMW. In certain embodiments, the input nodes Mode[0:2] correspond to three address lines of the memory device.

Figure 11:
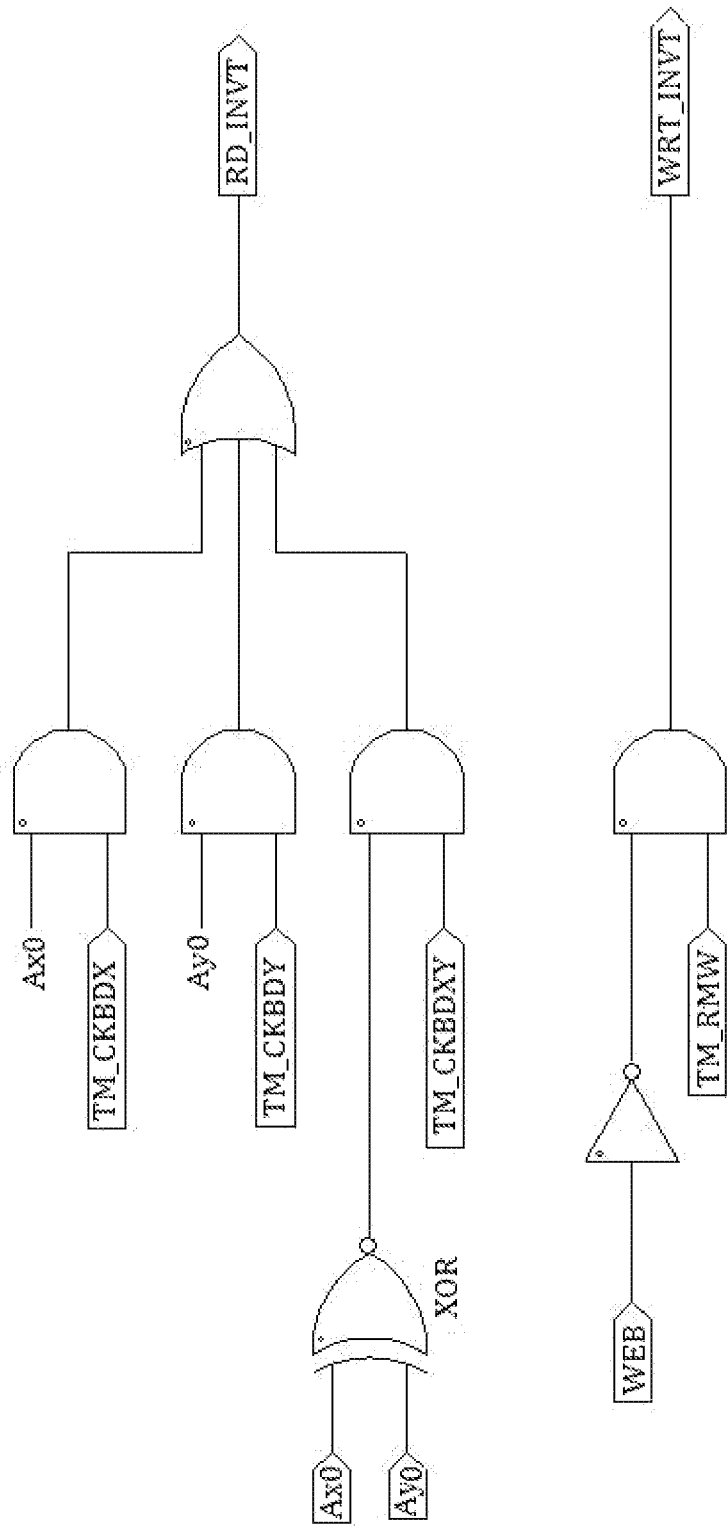
FIG. 11 illustrates a schematic of a cross selector of the test pattern generator shown in FIG. 6.

FIG. 11 shows a schematic of the cross selector of the test pattern generator shown in FIG. 6.

As shown in FIG. 11, the read inverting signal RD_INVT is generated according to the row bar signal TM_CKBDX, the column bar signal TM_CKBDY, the check-board signal TM_CKBDXY and the lowest bit $A_{x0}$ of the row address and the lowest bit $A_{y0}$ of the column address of the address signal.

The RMW signal TM_RMW is used to generate the write inverting signal WRT_INVT. Moreover, the generation of the write inverting signal is also controlled by the enable signal WEB.

Figure 12:
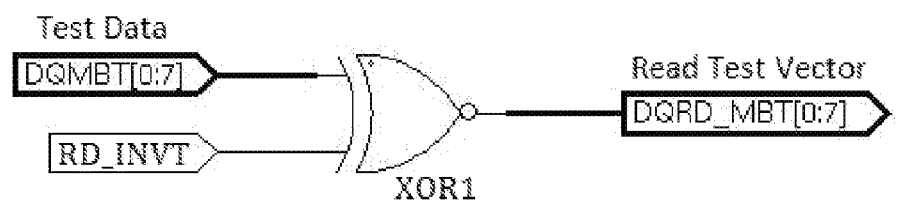
FIG. 12 illustrates a schematic of a read test vector generator of the test pattern generator shown in FIG. 6.

FIG. 12 shows a schematic of the read test vector generator of the test pattern generator shown in FIG. 6.

As shown in FIG. 12, the read test vector generator includes a multi-channel XOR gate XOR1. The XOR gate XOR1 is used to perform the XOR operation on the test data buffered by the first register and the read inverting signal RD_INVT bitwise so as to generate the required read test vector. For example, when the read inverting signal RD_INVT is "0", the read test vector is identical to the write test vector; when the read inverting signal RD_INVT is "1", the read test vector is inverse to the write test vector.

Figure 13:
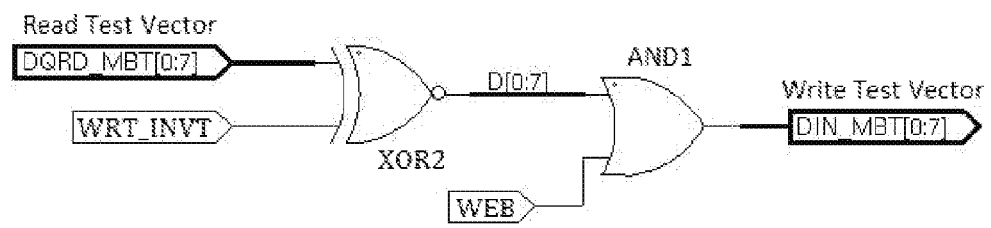
FIG. 13 illustrates a schematic of a write test vector generator of the test pattern generator shown in FIG. 6.

FIG. 13 shows a schematic of the write test vector generator of the test pattern generator shown in FIG. 6.

As shown in FIG. 13, the write test vector generator includes a multi-channel XOR gate XOR2 and an AND gate AND1. The XOR gate XOR2 is used to perform the XOR operation on the read test vector generated by the read test vector generator and the write inverting signal WT_INVT bitwise so as to generate the required write test vector. The AND gate AND1 may perform the AND operation on the generated write test vector to output the write vector at the node DIN_MBT[0:7] when the enable signal is valid.

Figure 14:
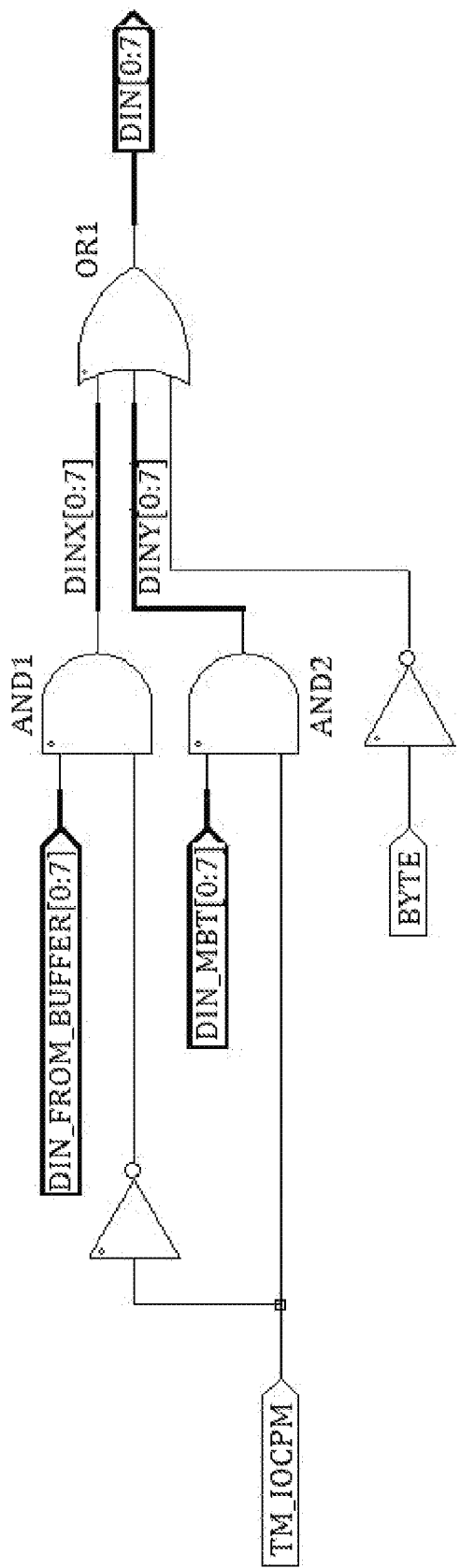
FIG. 14 illustrates a schematic of a multiplexer of the circuit shown in FIG. 3.

FIG. 14 shows a schematic of the multiplexer of the circuit shown in FIG. 3.

As shown in FIG. 14, the multiplexer includes two AND gates AND1 and AND2, and an OR gate OR1. The AND gate AND1 is used to perform the AND operation on the buffered data input signal and the inverting signal of the state control signal TM_IOCPM, the AND gate AND2 is used to perform the AND operation on the write test vector and the state control signal TM_IOCPM, and the OR gate OR1 is used to perform the OR operation on the above generated signals. As a result, the two different logic states "0" and "1" of the state control signal TM_IOCPM can control the multiplexer to selectively transmit the write test vector or the data input signal to the input port DIN[0:7] of the subject block.

Figure 15:
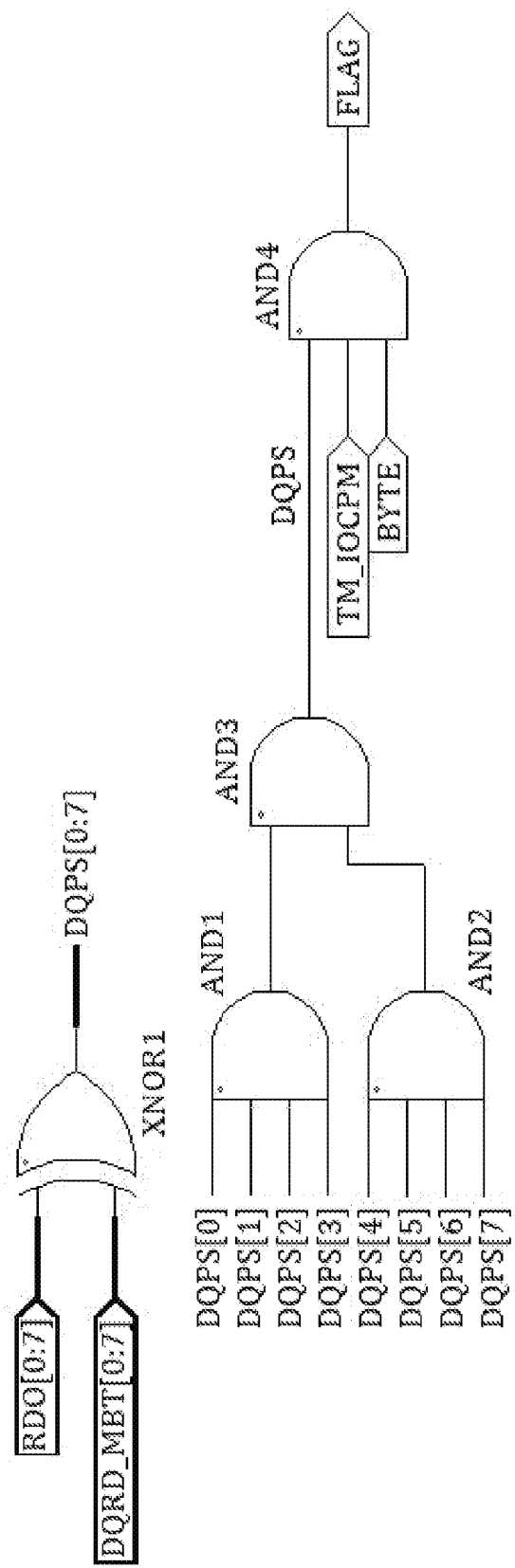
FIG. 15 illustrates a schematic of a comparator of the circuit shown in FIG. 3.

FIG. 15 shows a schematic of the comparator of the circuit shown in FIG. 3.

As shown in FIG. 15, the comparator includes an XNOR gate XNOR1 and several AND gates AND1-AND4. The XNOR gate XNOR1 includes multiple channels to perform the XNOR operation on the readout signal from the subject block and the read test vector bitwise. The AND gates AND1-AND3 are used to perform the AND operation on the inputs of all the channels of the XNOR gate XNOR1, which is the data of all the bits of the comparison result, to obtain the degenerated flag indicating the comparison result. The comparison result is further ANDed with the state control signal TM_IOCPM by the AND gate AND4 so that the flag is outputted when the state control signal TM_IOCPM is indicating that the circuit is in the test mode.

As mentioned above, FIGS. 9-15 exemplarily show the schematics of the modules of the circuit for testing the memory device. It will be readily appreciated by those skilled in the art that the modules may be implemented by any suitable circuitry based on different state transition tables.

Figure 16:
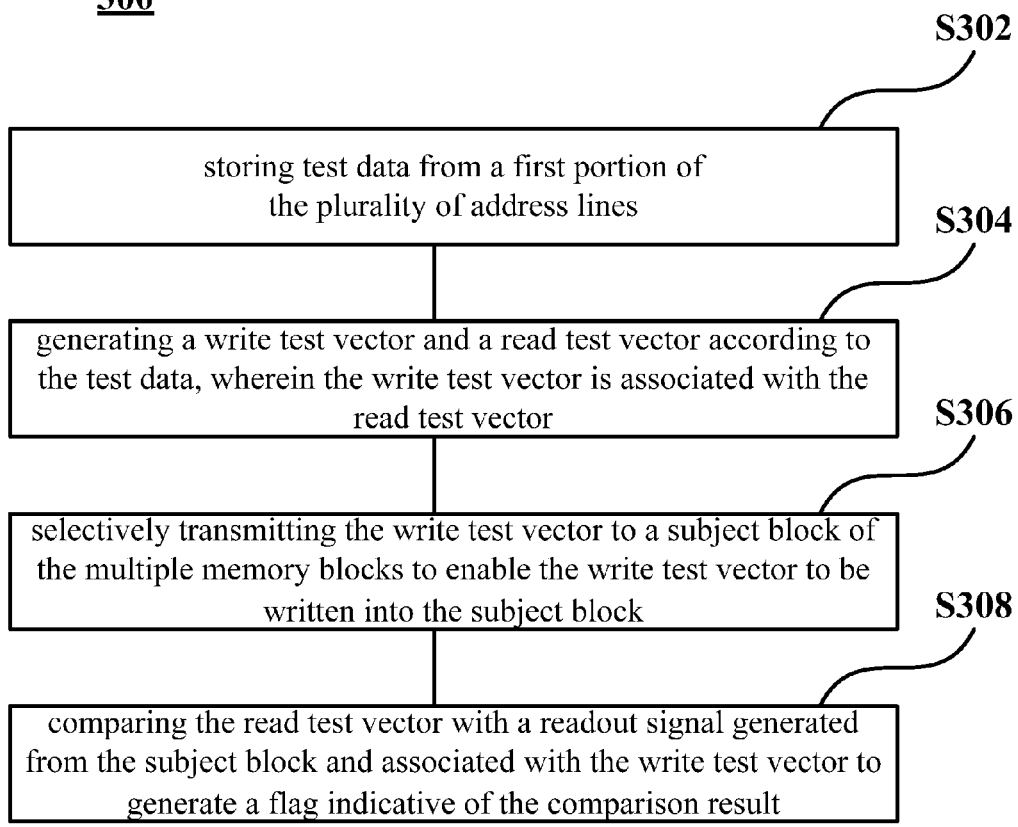
FIG. 16 illustrates a method 300 for testing a memory device according to an embodiment of the present application.

FIG. 16 shows a method 300 for testing a memory device according to an embodiment of the present application. The method 300 may be used to test whether the memory device 10 shown in FIG. 1 has any functional defect, i.e. whether or not the data read out from the memory cells in the memory device 10 is identical to the data written into the memory cells. The memory device has multiple memory blocks addressable via a plurality of address lines and capable of inputting and/or outputting data via a plurality of data lines.

As shown in FIG. 16, the method 300 includes:

Step S302, storing test data from a first portion of the plurality of address lines;

Step S304, generating a write test vector and a read test vector according to the test data, wherein the write test vector is associated with the read test vector;

Step S306, transmitting the write test vector to a subject block of the multiple memory blocks to enable the write test vector to be written into the subject block selectively; and Step S308, comparing the read test vector with a readout signal generated from the subject block and associated with the write test vector to generate a flag indicative of the comparison result.

In certain embodiments, Step S308 further includes: comparing each bit of the readout signal with each bit of the read test vector; and ANDing each bit of the comparison result to generate the flag.

In certain embodiments, the write test vector is inverse or identical to the read test vector.

Figure 17:
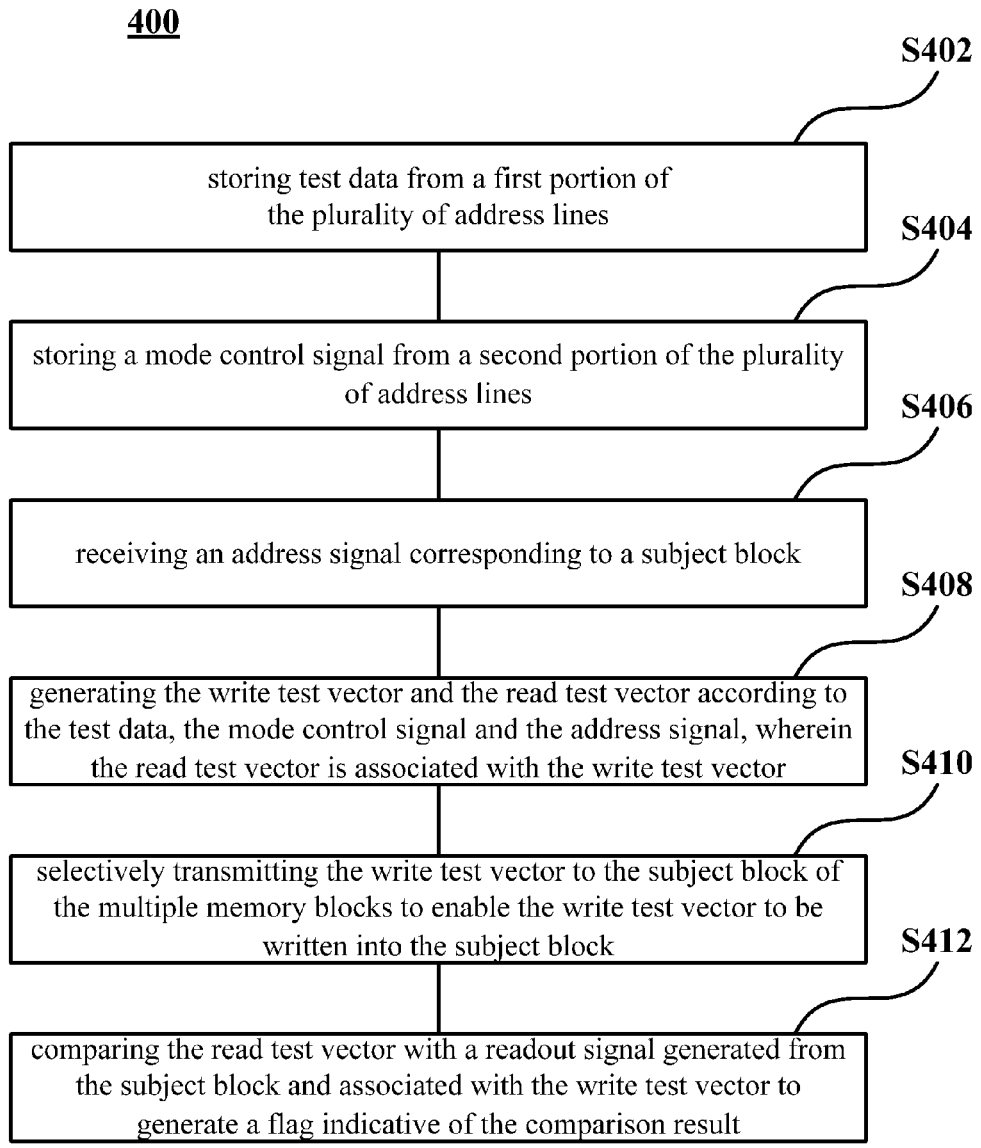
FIG. 17 illustrates a method 400 for testing a memory device according to an embodiment of the present application.

FIG. 17 shows a method 400 for testing a memory device according to an embodiment of the present application.

As shown in FIG. 17, the method 400 includes:

Step S402, storing test data from a first portion of the plurality of address lines;

Step S404, storing a mode control signal from a second portion of the plurality of address lines;

Step S406, receiving an address signal corresponding to a subject block;

Step S408, generating the write test vector and the read test vector according to the test data, the mode control signal and the address signal, wherein the read test vector is associated with the write test vector;

Step S410, transmitting the write test vector to the subject block of the multiple memory blocks to enable the write test vector to be written into the subject block selectively; and Step S412, comparing the read test vector with a readout signal generated from the subject block and associated with the write test vector to generate a flag indicative of the comparison result.

In certain embodiments, the address signal is received from the plurality of address lines.

In certain embodiments, the mode control signal includes a first part for controlling the generation of the read test vector according to the test data and the address signal, and a second part for controlling the generation of the write test vector according to the read test vector.

In certain embodiments, Step S408 further includes: converting the test data into the read test vector according to the address signal and the first part of the mode control signal; and converting the read test vector into the write test vector according to the second part of the mode control signal.

In certain embodiments, the method 400 further includes: receiving a state control signal and wherein Step S408 further includes storing the test data and the mode control signal at an edge of the state control signal.

In certain embodiments, Step S410 further includes transmitting the write test vector to the subject block during a first state of the state control signal after the edge of the state control signal.

In certain embodiments, the write test vector is prohibited to be transmitted to the subject block if the state control signal is at a second state different from the first state.

The operation of the above methods for testing the memory device may refer to the description of the circuit embodiments, which will not be elaborated herein.

The method for testing the memory device according to embodiments of the present application may be used to test the memory device by incorporating various test algorithms such as the Check-board, Zero-One, or March algorithm. In certain embodiments, the March algorithms may be used to test the memory device. The March algorithm is low in test complexity and high in failure coverage.

Figure 18:
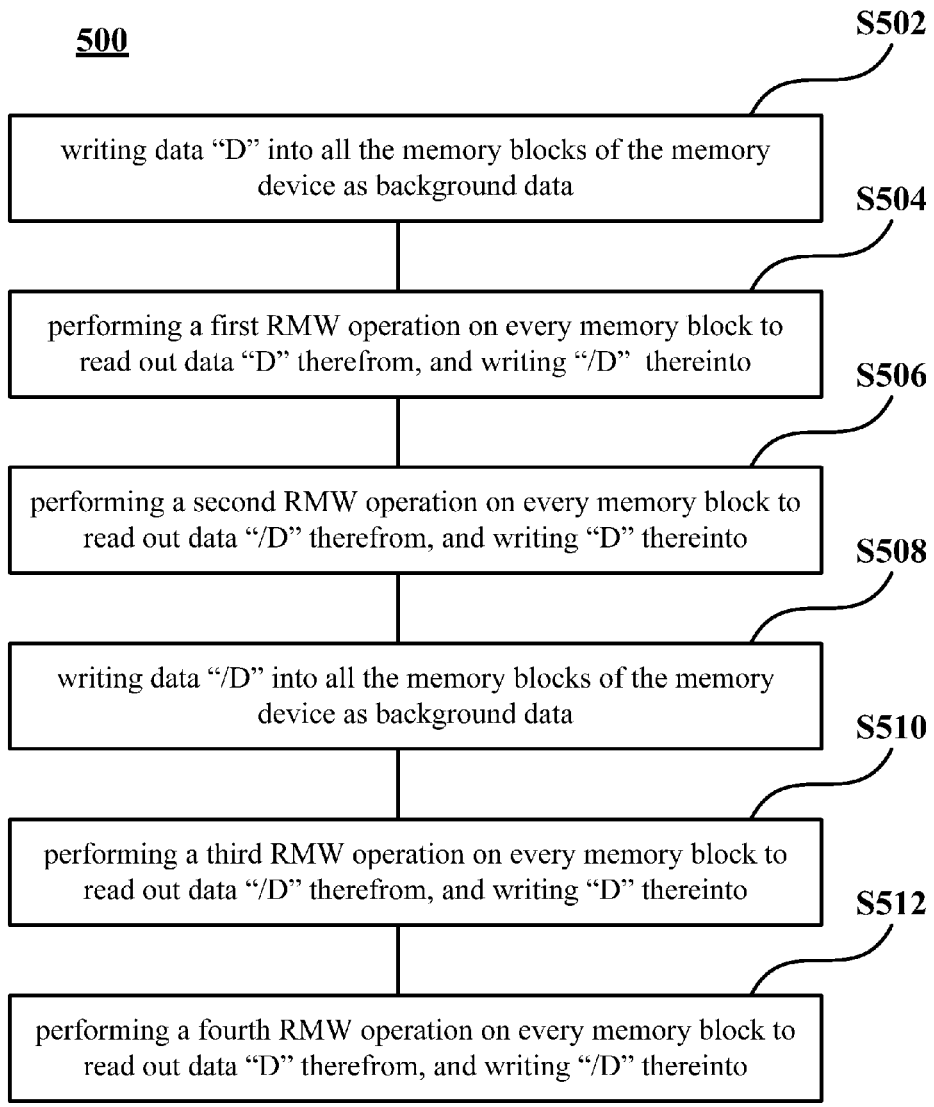
FIG. 18 illustrates the flow chart for testing the memory device by using the March algorithm according to an embodiment of the present application.

FIG. 18 shows a flow chart for testing the memory device by using the March algorithm according to an embodiment of the present application.

As shown in FIG. 18, the March algorithm includes the following steps:

Step S502, writing data "D" into all the memory blocks of the memory device as background data;

Step S504, performing a first RMW operation on every memory block to read out data "D" therefrom, and writing "/D" (i.e. the inverse binary code of "D") thereinto;

Step S506, performing a second RMW operation on every memory block to read out data "/D" therefrom, and writing "D" thereinto;

Step S508, writing data "/D" into all the memory blocks of the memory device as background data;

Step S510, performing a third RMW operation on every memory block to read out data "/D" therefrom, and writing "D" thereinto;

Step S512, performing a fourth RMW operation on every memory block to read out data "D" therefrom, and writing "/D" thereinto.

Hereinafter, the process for implementing the above March algorithm by using the method according to embodiments of the present application will be elaborated with reference to FIGS. 17 and 18.

Specifically, in Step S502, at the first edge of the state control signal TM_IOCPM, i.e. after entering into the test mode, the test machine provides the test data "D" at the first portion of the address lines and the mode control signal at the second portion of the address lines. The first part of the mode control signal may be provided as required by the test pattern, and the second part of the mode control signal may be provided to indicate that the memory device is not in the RMW mode. Afterwards, the state control signal TM_IOCPM is maintained to be valid to generate the write and read test vectors. Under this condition, the generated write and read test vectors are both "D". After that, the state control signal TM_IOCPM is set to be invalid in allowing the memory device to quit the test mode.

In Step S504, at the second edge of the state control signal TM_IOCPM, the test machine provides the test data "D" at the first portion of the address lines and the mode control signal at the second portion of the address lines. The first part of the mode control signal is the same as that provided in Step S502, and the second part of the mode control signal is provided to indicate that the memory device is in the RMW mode.

Afterwards, the state control signal TM_IOCPM is maintained to be valid to generate the write and read test vectors. Under this condition, the generated write test vector is "/D", and the generated read test vector is "D". During this period, the data "D" written into each memory block of the memory device in Step S502 is read out as the readout signal, which is compared with the read test vector "D" generated in Step S504 to determine whether the memory blocks have defects. After that, the write test vector "/D" generated in Step S504 is written into the memory blocks. Then the state control signal TM_IOCPM is set to be invalid in allowing the memory device to quit the test mode.

In Step S506, at the third edge of the state control signal TM_IOCPM, the test machine provides the test data "/D" at the first portion of the address lines and the mode control signal at the second portion of the address lines. The first part of the mode control signal is the same as that provided in Step S502, and the second part of the mode control signal is provided to indicate that the memory device is in the RMW mode.

Afterwards, the state control signal TM_IOCPM is maintained to be valid to generate the write and read test vectors. Under this condition, the generated write test vector is "D", and the generated read test vector is "/D". During this period, the data "/D" written into each memory block of the memory device in Step S504 is read out as the readout signal, which is compared with the read test vector "/D" generated in Step S506 to determine whether the memory blocks have defects. After that, the write test vector "D" generated in Step S506 is written into the memory blocks. Then the state control signal TM_IOCPM is set to be invalid in allowing the memory device to quit the test mode.

In Step S508, at the fourth edge of the state control signal TM_IOCPM, the test machine provides the test data "/D" at the first portion of the address lines and the mode control signal at the second portion of the address lines. The first part of the mode control signal may be provided as required by the test pattern, and the second part of the mode control signal may be provided to indicate that the memory device is not in the RMW mode. Afterwards, the state control signal TM_IOCPM is maintained to be valid to generate the write and read test vectors. Under this condition, the generated write and read test vectors are both "/D". After that, the state control signal TM_IOCPM is set to be invalid in allowing the memory device to quit the test mode.

In Step S510, at the fifth edge of the state control signal TM_IOCPM, the test machine provides the test data "/D" at the first portion of the address lines and the mode control signal at the second portion of the address lines. The first part of the mode control signal is the same as that provided in Step S508, and the second part of the mode control signal is provided to indicate that the memory device is in the RMW mode.

Afterwards, the state control signal TM_IOCPM is maintained to be valid to generate the write and read test vectors. Under this condition, the generated write test vector is "D", and the generated read test vector is "/D". During this period, the data "/D" written into each memory block of the memory device in Step S508 is read out as the readout signal, which is compared with the read test vector "/D" generated in Step S510 to determine whether the memory blocks have defects. After that, the write test vector "D" generated in Step S510 is written into the memory blocks. Then the state control signal TM_IOCPM is set to be invalid in allowing the memory device to quit the test mode.

In Step S512, at the sixth edge of the state control signal TM_IOCPM, the test machine provides the test data "D" at the first portion of the address lines and the mode control signal at the second portion of the address lines. The first part of the mode control signal is the same as that provided in Step S508, and the second part of the mode control signal is provided to indicate that the memory device is in the RMW mode.

Afterwards, the state control signal TM_IOCPM is maintained to be valid to generate the write and read test vectors. Under this condition, the generated write test vector is "/D", and the generated read test vector is "D". During this period, the data "D" written into each memory block of the memory device in Step S510 is read out as the readout signal, which is compared with the read test vector "D" generated in Step S512 to determine whether the memory blocks have defects. After that, the write test vector "/D" generated in Step S512 is written into the memory blocks. Then the state control signal TM_IOCPM is set to be invalid in allowing the memory device to quit the test mode.

After performing the above steps, the process for testing the memory device by using the March algorithm is completed. It will be readily appreciated that, in practical applications, the test sequence (i.e. the scanning sequence of the addresses) for the various memory blocks in the memory device may be defined by the test machine. Any required sequence can be used, for example, from the highest bit to the lowest bit of the address, from the lowest bit to the highest bit of the address, or change alternately, etc.

In view of the foregoing, the method for testing the memory device according to the present application can transmit the test data for generation of the test vectors to the subject memory block via the address lines, thereby it is not required to provide data channels for inputting the test pattern in the test machine. The test result may be degenerately represented by the flag and outputted, i.e., the bit of the flag is less than that of a storage byte of each memory block. In this way, it is not required to integrate additional data channels in the test machine to provide the test data to the subject memory device. The number of memory devices parallel tested on the test machine may significantly increase, and therefore the cost and time for the wafer level test may be reduced.

The embodiments of the present application may be implemented by hardware, software or any combination thereof. The hardware may be implemented by specific logic circuits, and the software may be stored in a memory and executed by appropriate instruction executing systems. For example, the software may be executed by a micro processor or a specifically designed hardware.

It should be noted that, although several modules or sub-modules of the circuit have been described in the previous paragraphs, such division is not mandatory. The functions and features of two or more modules described above may be embodied in one module. On the other hand, the function and feature of any one module described above may be embodied in two or more modules.

Furthermore, although the operation of a method according to the present application is illustrated with reference to the accompanying drawings in a specific sequence, the present application may be practiced using process flows that differ from that illustrated. Additionally, it should be noted that not all steps are required in every embodiment. In other words, one or more of the steps may be omitted or replaced, without departing from the concept and scope of the invention. In certain embodiments, steps may be performed in different order, in parallel with one another, or omitted entirely, and/or certain additional steps may be performed without departing from the scope of the present application.

While the present application has been illustrated and described in detail in the drawings and the description, such illustration and description are to be considered illustrative or exemplary and not restrictive; the present application is not limited to the disclosed embodiments. Other variations to the disclosed embodiments can be understood and implemented by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. Any reference signs in the claims should not be construed as a limitation to the scope. The scope and concept of the application is defined by the appended claims.

What is claimed is:

1. A circuit for testing a memory device having multiple memory blocks addressable via a plurality of address lines and capable of inputting and/or outputting data via a plurality of data lines, comprising:
a test pattern generator coupled to a first portion of the plurality of address lines to receive test data and coupled to a second portion of the plurality of address lines to receive a mode control signal, and configured to store the test data and the mode control signal, and to generate a write test vector and a read test vector according to the test data, the mode control signal and an address signal corresponding to a subject block of the multiple memory blocks, wherein the write test vector is associated with the read test vector;
a multiplexer coupled to the test pattern generator, and configured to selectively transmit the write test vector to the subject block to enable the write test vector to be written into the subject block; and
a comparator coupled to the test pattern generator and the subject block, and configured to compare the read test vector with a readout signal generated from the subject block and associated with the write test vector, and to generate a flag indicative of the comparison result;
wherein the test pattern generator comprises:
a first register coupled to the first portion of the plurality of address lines and coupled to receive a state control signal, and configured to store the test data at an edge of the state control signal;
a second register coupled to the second portion of the plurality of address lines and coupled to receive the state control signal, and configured to store the mode control signal at the edge of the state control signal;
a mode controller coupled to the second register, and configured to generate a read inverting signal and a write inverting signal according to the mode control signal;
a read test vector generator coupled to the first register and the mode controller, and configured to generate the read test vector according to the test data and the read inverting signal; and
a write test vector generator coupled to the read test vector generator and the mode controller, and configured to generate the write test vector according to the read test vector and the write inverting signal.

2. The circuit of claim 1, wherein the address signal is received from the plurality of address lines.

3. The circuit of claim 1, wherein the mode control signal includes a first part for controlling the generation of the read test vector according to the test data and the address signal, and a second part for controlling the generation of the write test vector according to the read test vector.

4. The circuit of claim 1, wherein the multiplexer is further coupled to the plurality of data lines to receive an input data signal and coupled to receive a state control signal, and configured to selectively transmit the input data signal or the write test vector to the subject block in response to the state control signal.

5. The circuit of claim 4, wherein the multiplexer comprises a plurality of channels for multiplexing each line of the plurality of data lines with each bit of the write test vector.

6. The circuit of claim 1, wherein the comparator comprises:
an XNOR gate having a plurality of channels for comparing each bit of the readout signal with each bit of the read test vector; and
an AND gate for ANDing each bit of the comparison result to generate the flag.

7. The circuit of claim 6, wherein the write test vector is inverse or identical to the read test vector.

8. The circuit of claim 1, wherein the multiplexer and the comparator are integrated in each block of the multiple memory blocks of the memory device.

9. A method for testing a memory device having multiple memory blocks addressable via a plurality of address lines and capable of inputting and/or outputting data via a plurality of data lines, comprising:
storing test data from a first portion of the plurality of address lines;
storing a mode control signal from a second portion of the plurality of address lines;
receiving an address signal corresponding to a subject block of the multiple memory blocks;
generating a write test vector and a read test vector according to the test data, the mode control signal and the address signal, wherein the write test vector is associated with the read test vector;
transmitting the write test vector to the subject block to enable the write test vector to be written into the subject block selectively; and
comparing the read test vector with a readout signal generated from the subject block and associated with the write test vector to generate a flag indicative of the comparison result;
wherein a generating step comprises:
receiving a state control signal;
storing at an edge of the state control signal the test data via a first register and the mode control signal via a second register;
generating a read inverting signal and a write inverting signal according to the mode control signal via a mode controller coupled to the second registers;
generating the read test vector according to the test data and the read inverting signal via a read test vector generator coupled to the first register and the mode controller; and
generating the write test vector according to the read test vector and the write inverting signal via a write test vector generator coupled to the read test vector generator and the mode controller.

10. The method of claim 9, wherein the address signal is received from the plurality of address lines.

11. The method of claim 9, wherein the mode control signal includes a first part for controlling the generation of the read test vector according to the test data and the address signal, and a second part for controlling the generation of the write test vector according to the read test vector.

12. The method of claim 11, wherein the generating step further comprises:
converting the test data into the read test vector according to the address signal and the first part of the mode control signal; and
converting the read test vector into the write test vector according to the second part of the mode control signal.

13. The method of claim 9, wherein a transmitting step further comprises transmitting the write test vector to the subject block during a first state of the state control signal after the edge of the state control signal.

14. The method of claim 13, wherein the write test vector is prohibited to be transmitted to the subject block if the state control signal is at a second state different from the first state.

15. The method of claim 9, wherein a comparing step further comprises:

comparing each bit of the readout signal with each bit of the read test vector; and ANDing each bit of the comparison result to generate the flag.

16. The method of claim 9, wherein the write test vector is inverse or identical to the read test vector.

* * * * *